United States Patent
Ahmad et al.

(10) Patent No.: US 6,965,250 B1
(45) Date of Patent: Nov. 15, 2005

(54) REDUCED DELAY POWER FAIL-SAFE CIRCUIT

(75) Inventors: Zamir Ahmad, Newark, CA (US); Jeffrey F. Wong, Freemont, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 111 days.

(21) Appl. No.: 10/716,690

(22) Filed: Nov. 19, 2003

(51) Int. Cl.[7] .......................................... H03K 19/007
(52) U.S. Cl. ....................................... 326/14; 327/143
(58) Field of Search ............................... 326/9, 14, 37, 326/38, 82, 80, 81; 327/142, 143

(56) References Cited

U.S. PATENT DOCUMENTS

| | | | |
|---|---|---|---|
| 4,649,292 A * | 3/1987 | Rusznyak | 327/82 |
| 5,345,422 A * | 9/1994 | Redwine | 365/189.09 |
| 6,472,912 B1 * | 10/2002 | Chiu et al. | 327/143 |
| 6,737,885 B1 * | 5/2004 | Shumarayev et al. | 326/81 |
| 6,784,718 B2 * | 8/2004 | Okamoto et al. | 327/333 |
| 6,853,221 B1 * | 2/2005 | Wert | 327/143 |
| 2002/0171461 A1 * | 11/2002 | Yamazaki et al. | 327/143 |

* cited by examiner

*Primary Examiner*—Don Le
(74) *Attorney, Agent, or Firm*—Zagorin O'Brien Graham LLP

(57) ABSTRACT

An improved power fail-safe has an effective maximum delay of two gate delays from an input operably powered by a first power supply to a first and a second output operably powered by a second power supply. The first and second outputs have predetermined values during an interval when the first power supply has failed and the second power supply is active. The first and second power supplies may be based at least in part on different power domains. The first power supply may be based at least in part on a core power domain and the second power supply may be based at least in part on an I/O power domain.

32 Claims, 4 Drawing Sheets

| VDD | VDDO | DATA_IN | OUT_1 | OUT_2 |
|---|---|---|---|---|
| ACTIVE | ACTIVE | 0 | 1 | 0 |
| ACTIVE | ACTIVE | 1 | 0 | 1 |
| FAIL | ACTIVE | ------ | 0 | 1 |

REDUCED DELAY POWER FAIL-SAFE CIRCUIT

BACKGROUND

1. Field of the Invention

The present invention relates generally to integrated circuits and, more particularly, to I/O circuits.

2. Description of the Related Art

Typically, I/O circuits are responsible for communication between the integrated circuit and the outside world. These circuits may also perform power domain transfers e.g., transferring from a core power domain to an I/O power domain. Some system designs specify that upon a core power failure, the I/O signals have a predetermined state (i.e., low or high) at an integrated circuit output. Circuits that generate these predetermined states are known as power fail-safe circuits. The speed of systems including power fail-safe circuits are ever increasing, reducing associated circuit timing budgets. Thus, a need exists for a power fail-safe circuit design that introduces a reduced delay into a system including the power fail-safe circuit.

SUMMARY

An improved power fail-safe circuit has been discovered. An integrated circuit has an effective maximum delay of two gate delays from an input operably powered by a first power supply to first and second outputs operably powered by a second power supply. The first and second outputs have predetermined values during an interval when the first power supply has failed and the second power supply is active. The first and second power supplies may be based at least in part on different power domains. The first power supply may be based at least in part on a core power domain and the second power supply may be based at least in part on an I/O power domain.

In some embodiments of the present invention, an integrated circuit includes an input operably powered by a first power supply and a first and a second output operably powered by the second power supply. The integrated circuit has an effective maximum delay of two gate delays from the input signal to the first and the second outputs. The first and second outputs have predetermined values during an interval when the first power supply has failed and the second power supply is active. The integrated circuit may include a first and a second node coupled, respectively, to the first and the second outputs and a first and a second device coupled, respectively, to the first and the second nodes. The first device may be responsive to the first power supply and coupled to the second power supply. The first device may be configured as a diode. The first and the second power supplies may be based on different power domains.

In some embodiments of the present invention, a method includes generating, based on an input operably powered by a first power supply, complementary signals for at least a first and a second output operably powered by a second power supply in at most two gate delays during an interval where the first power supply is active. The method includes sensing a failure in the first power supply and respectively introducing predetermined signals to the first and second outputs during an interval when the first power supply has failed and the second power supply is active. The method may include matching a first and second delay from the input to the first and the second outputs. The first and the second power supplies are based on different power domains.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
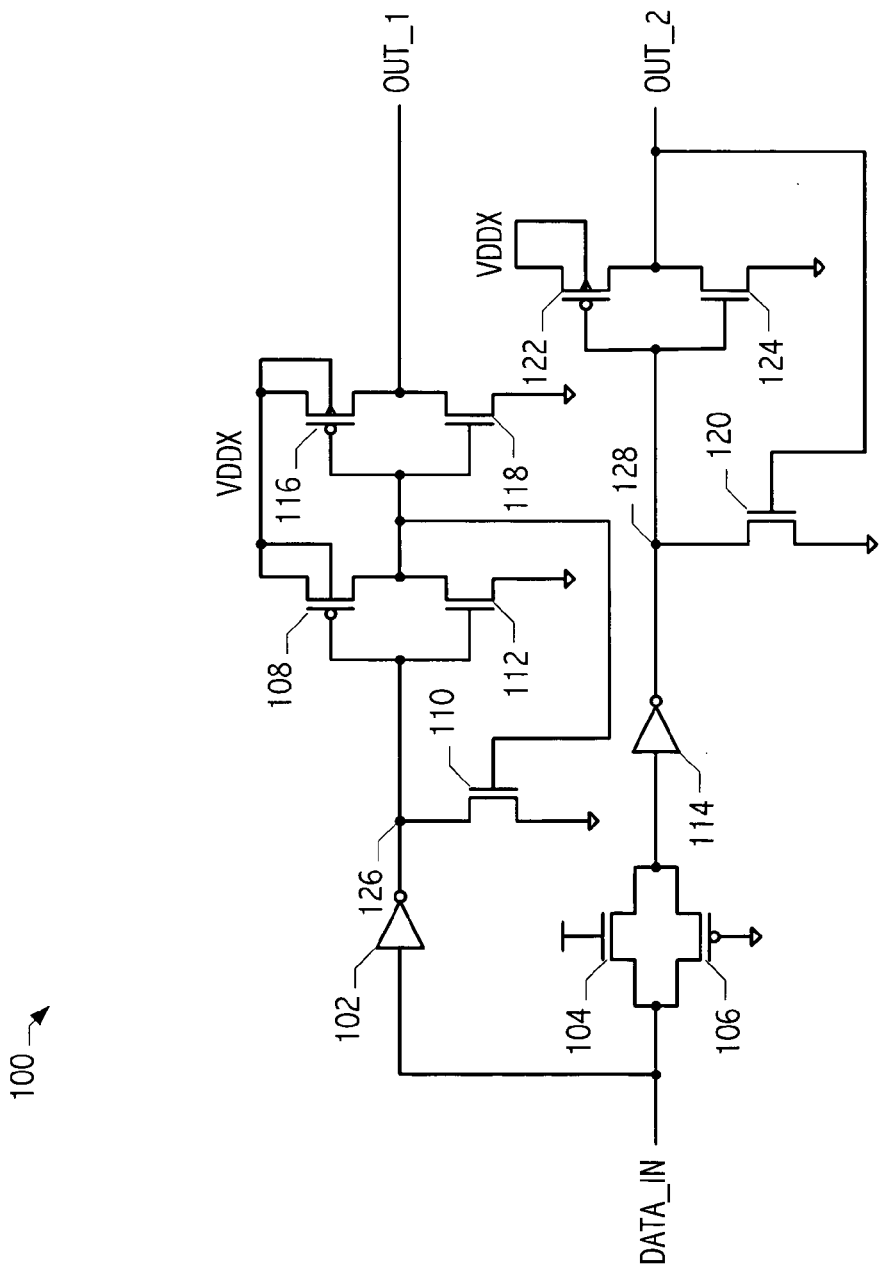
FIG. 1 depicts an illustrative power fail-safe circuit.

FIG. 1 depicts an illustrative power fail-safe circuit, which is largely conventional in design. Circuit 100 receives DATA_IN and generates complementary outputs OUT_1 and OUT_2. DATA_IN, inverters 102 and 114, and the transmission gate formed by transistors 104 and 106, are powered by a core voltage (VDD). The remaining power supply connections in circuit 100 are powered by a voltage (VDDX) based on an I/O power domain (VDDO).

Figures 2, 3:
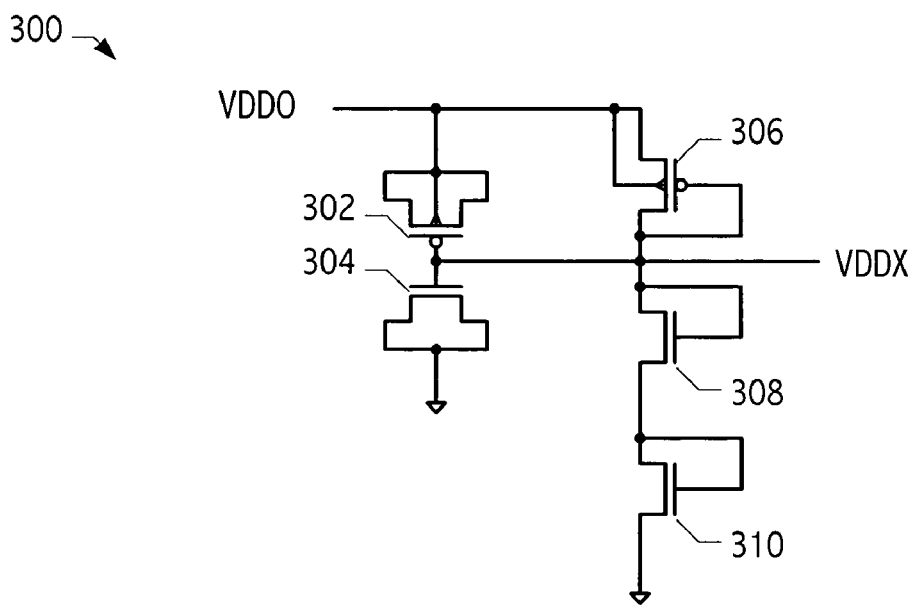
FIG. 2 depicts a truth table illustrating the operation of a power fail-safe circuit, in accordance with some embodiments of the present invention.
FIG. 3 depicts an illustrative configuration of a voltage divider circuit, in accordance with some embodiments of the present invention.

VDD and VDDO may have different voltage levels since the core integrated circuit may be implemented in a high-speed, low-power process technology with a lower voltage requirement (e.g., 1.2V) than the I/O voltage level (e.g., 1.5V) that is required for interaction with other integrated circuits on a motherboard of a computer system. Operating core circuits at the I/O voltage level may produce circuit failures, e.g., in some realizations, from gate oxide stress. To avoid these circuit failures, a power transfer stage of an I/O circuit operates at a voltage level supplied by VDDX, a voltage level substantially equivalent to the voltage level of VDD. VDDX may be generated by a typical voltage divider circuit. An illustrative configuration of a voltage divider circuit is illustrated in FIG. 3. Transistors 302 and 304 are configured as capacitors to provide stability. Transistors 306, 308, and 310 are sized to divide VDDO down to a level that is substantially equivalent to the level supplied by VDD. The devices illustrated in FIG. 1 and FIG. 3 are sized by circuit simulation, or by any other method of sizing devices known in the art.

Referring back to FIG. 1, during normal operation, VDDO and VDD are both active and circuit 100 generates signals on OUT_1 and OUT_2 according to the truth table illustrated in FIG. 2. When DATA_IN is low (i.e., '0'), OUT_1 is high (i.e., '1') and OUT_2 is low. When DATA_IN is high, OUT_1 is low and OUT_2 is high. DATA_IN is coupled to OUT_1 via a data path including inverter 102, the inverter formed by transistors 108 and 112, and the inverter formed by transistors 116 and 118. This data path has a delay of three gate delays. DATA_IN is coupled to OUT_2 via the data path including the transmission gate formed by transistors 104 and 106, inverter 114, and the inverter formed by transistors 122 and 124. Circuit 100 preferably generates OUT_1 and OUT_2 with a matched delay. To achieve the matched delay, the transmission gate including transistors 104 and 106 provides an effective gate delay in the path between DATA_IN and OUT_2. Thus, the delay between DATA_IN and both OUT_1 and OUT_2 is effectively three gate delays.

When VDD fails, but VDDO is active, the outputs of inverter 114 and inverter 102 will be zero, but the devices powered by VDDX will continue to receive power. Transistors 110 and 120 ensure that node 126 and node 128 are low, respectively, by forming, in essence, a "cheater" latch for both nodes 126 and 128. The low value of nodes 126 and 128 produces a predetermined state at the corresponding outputs, being a '0' at OUT_1 and a '1' at OUT_2, respectively. When VDD is active and VDDO fails, OUT_1 and OUT_2 will be zero because VDDX fails as well.

Figure 4:
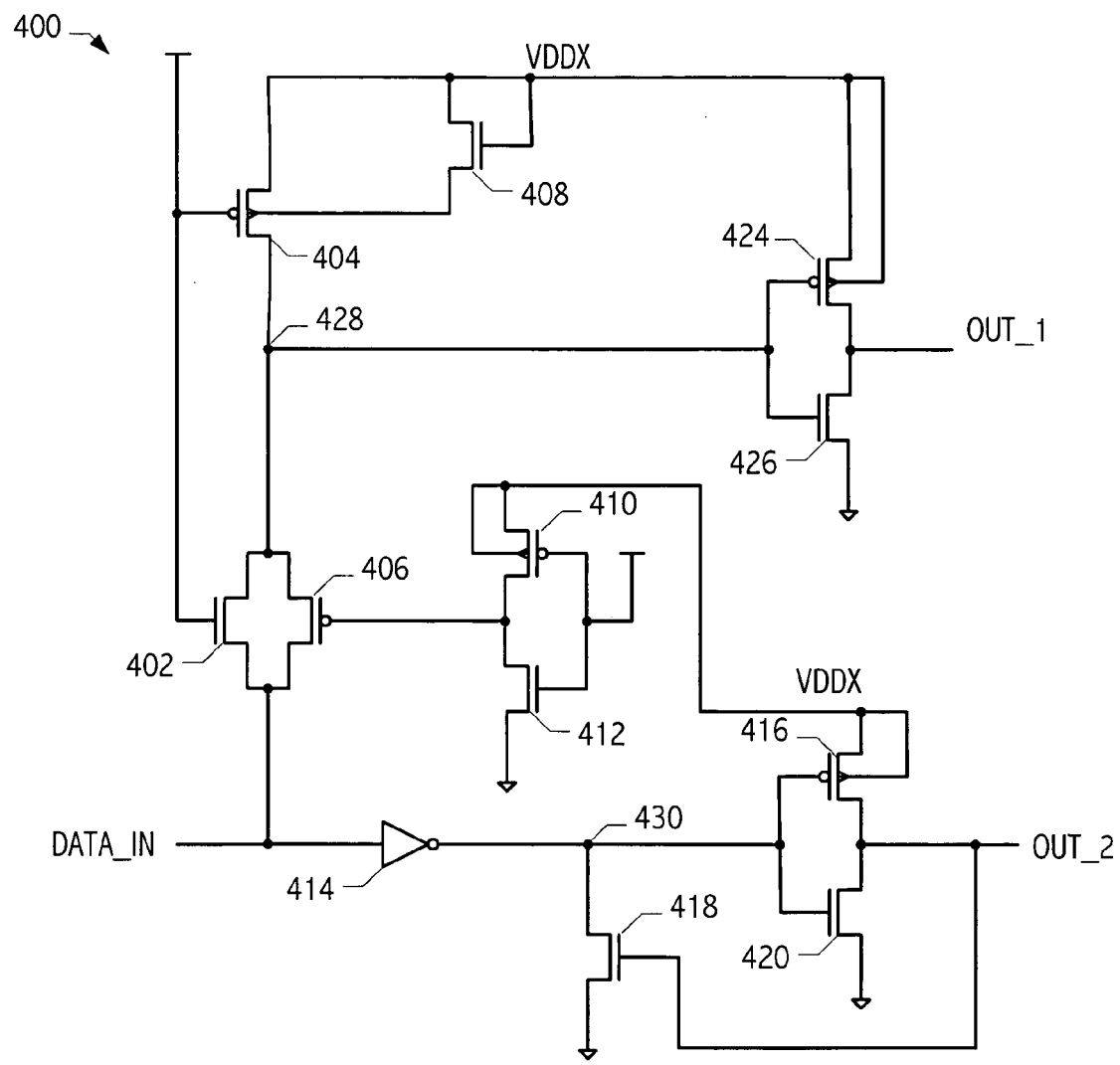
FIG. 4 depicts an illustrative configuration of a power fail-safe circuit, in accordance with some embodiments of the present invention.

In order to increase circuit speed, it is desirable to reduce the number of gate delays in the paths between DATA_IN and OUT_1 and OUT_2 of the power fail-safe circuit. FIG. 4 illustrates a reduced delay power fail-safe circuit. During normal operation, VDDO and VDD are both active and circuit 400 generates signals on OUT_1 and OUT_2 according to the truth table illustrated in FIG. 2. When DATA_IN is low, OUT_1 is high and OUT_2 is low. When DATA_IN is high, OUT_1 is low and OUT_2 is high. DATA_IN is coupled to OUT_1 via a data path including a transmission gate formed by transistors 402 and 406 and the inverter formed by transistors 424 and 426. The delay of this data path is effectively two gate delays. DATA_IN is coupled to OUT_2 via a data path including inverter 414 and the inverter formed by transistors 416 and 420. The delay of both data paths from DATA_IN to OUT_1 and OUT_2 is two gate delays, providing an improvement of one gate delay over circuit 100.

When VDD fails, but VDDO is active, the output of inverter 414 will be at or near zero, and fail-safe device 418 reinforces that zero to ensure that OUT_2 has a high value. Fail-safe device 404 pulls node 428 high when VDD fails and the inverter formed by transistors 424 and 426 pulls OUT_1 low. The transmission gate formed by transistors 402 and 406 is useful in the path between DATA_IN and OUT_1 to match the delay between DATA_IN and OUT_2. This transmission gate passes DATA_IN to node 428 when VDD is active, but is disabled when VDD fails, thus effectively decoupling node 428 from DATA_IN and allowing transistor 404 to drive node 428 high and thus producing a low value at OUT_1.

Transistor 404 is a PMOS transistor (i.e., p-transistor) designed to have a large enough gain, achieved by an appropriate W/L ratio, to overcome a charge on node 428 after VDD fails, but small enough to minimize capacitive loading and prevent substantially affecting regular operation of node 428 when VDD is active. Similarly, transistor 418 is sized to have a large enough gain, achieved by an appropriate W/L ratio, to fully discharge node 430 when VDD fails, but small enough to prevent substantially affecting node 430 with capacitive loading or with the transient current that flows through such a "cheater" latch until OUT_2 switches low when VDD is active. In addition, transistors 404 and 418 may be sized with a long channel to minimize leakage when turned off. For example, transistors 404 and 418 may have a channel length of 2 microns when a typical channel length is 0.2 microns in a 1.2 Volt 0.13 micron technology. The devices illustrated in FIG. 4 are sized by circuit simulation, or by any other method of sizing devices known in the art.

Figure 5:
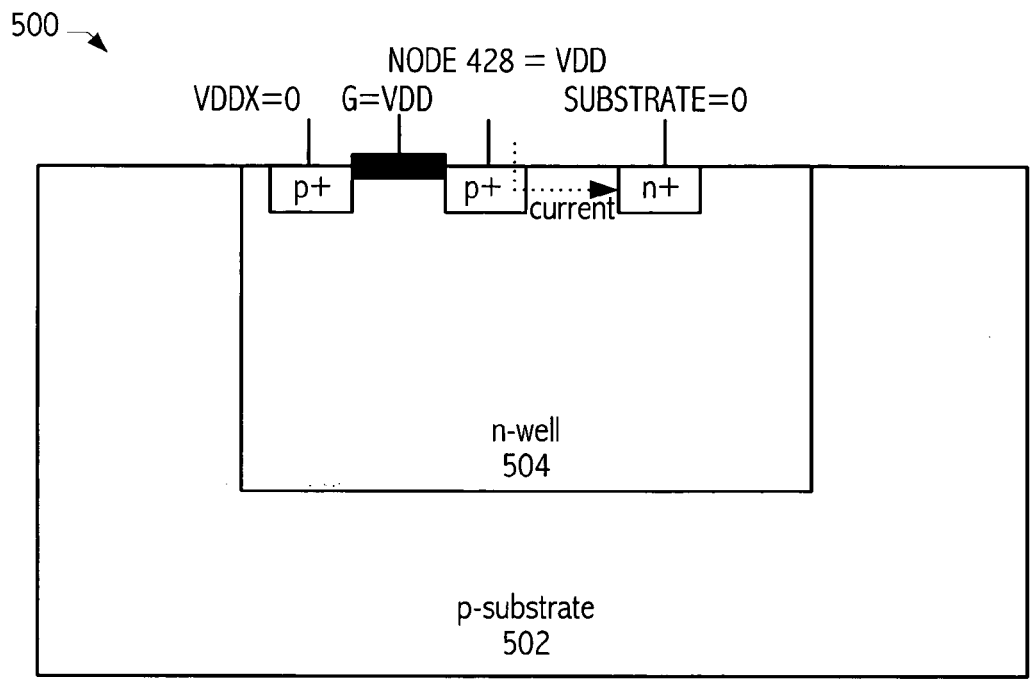
FIG. 5 depicts an illustrative configuration of a p-transistor, in accordance with some embodiments of the present invention.
Figure 6:
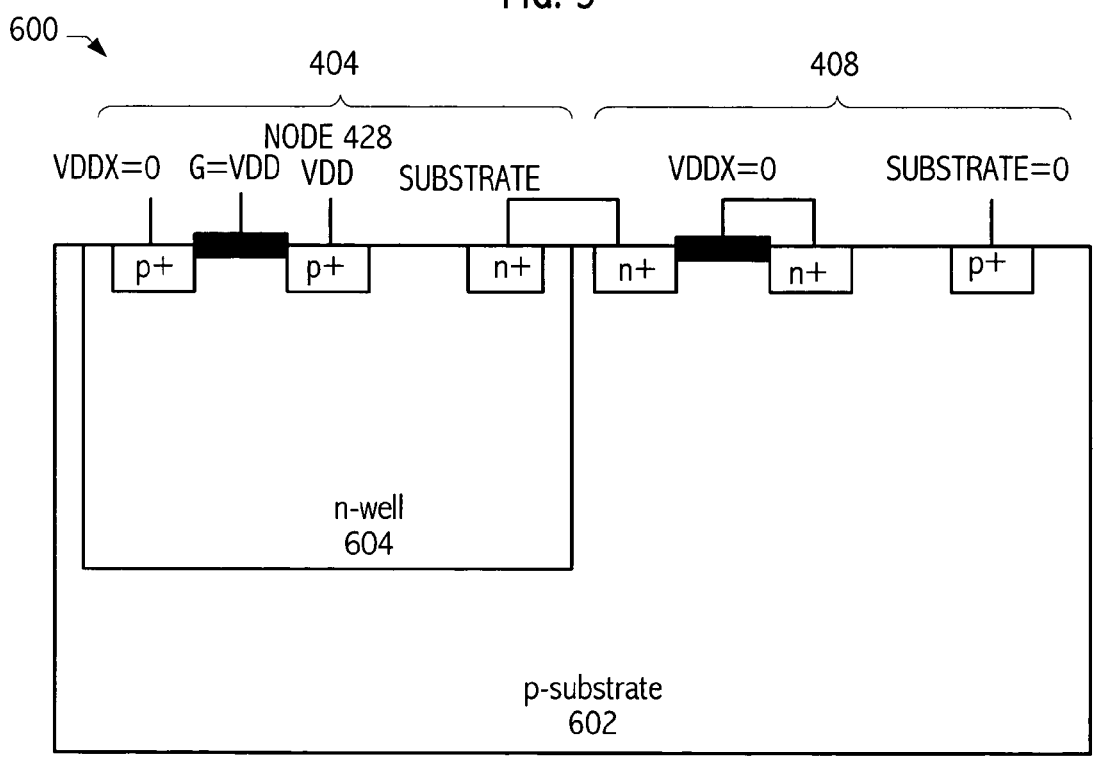
FIG. 6 depicts an illustrative configuration of a p-transistor, in accordance with some embodiments of the present invention.

In some typical transistor configurations, the bulk terminal (i.e., "substrate" terminal) of a p-transistor is coupled to power or to the highest circuit voltage. However, if the bulk terminal of transistor 404 is directly coupled to VDDX, during an interval when VDD is active and VDDO fails, the bulk of transistor 404 would have a voltage of zero. During this interval, if DATA_IN is high, node 428 is high and will forward bias a p-n junction between the drain and bulk of transistor 404. The forward bias of this p-n junction creates a current path that causes a large current to flow from node 428 to the bulk of transistor 404, discharging node 428, and causing a considerable amount of power dissipation. FIG. 5 illustrates this phenomenon. FIGS. 4 and 6 illustrate one solution for avoiding this behavior. Instead of connecting the bulk of transistor 404 to VDDX directly, the bulk of transistor 404 is coupled to VDDX via NMOS transistor (i.e., n-transistor) 408. N-transistor 408, which effectively functions as a diode, is effectively off when VDDX fails, thus preventing a current path between node 428 and VDDX.

The description of the invention set forth herein is illustrative, and is not intended to limit the scope of the invention as set forth in the following claims. For example, while circuits and physical structures are generally presumed, it is well recognized that in modem semiconductor design and fabrication, physical structures and circuits may be embodied in computer readable descriptive form suitable for use in subsequent design, test, or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures.

In addition, the applications to which the invention may be applied are not limited to I/O circuits, but may extend to other circuits with functions similar to the requirements of a fail-safe circuit. In some realizations of the invention, multiple instantiations of the invention are utilized. The invention may be modified to receive data from an I/O circuit, transfer power from an I/O power domain to a core power domain and/or generate a predetermined state at an integrated circuit input upon an I/O power failure. Other variations and modifications of the embodiments disclosed herein, may be made based on the description set forth herein, without departing from the scope and spirit of the invention as set forth in the following claims.

What is claimed is:

1. An integrated circuit, having an effective maximum delay of two gate delays from an input operably powered by a first power supply to first and second outputs operably powered by a second power supply, the first and second outputs having predetermined values during an interval when the first power supply has failed and the second power supply is active.

2. The integrated circuit, as recited in claim 1, wherein the first and the second power supplies are based at least in part on different power domains.

3. The integrated circuit, as recited in claim 1, wherein the first power supply is based at least in part on a core power domain and the second power supply is based at least in part on an I/O power domain.

4. The integrated circuit, as recited in claim 3, wherein the second power supply includes a voltage division of an I/O power supply.

5. The integrated circuit, as recited in claim 4, wherein the second power supply has a voltage level substantially equivalent to a voltage level of the first power supply.

6. The integrated circuit, as recited in claim 1, wherein the effective maximum delay from the input to each of the first and second outputs is substantially equivalent.

7. The integrated circuit, as recited in claim 1, wherein the first and second outputs have complementary values based on an input signal during an interval when the first power supply is active and the second power supply is active.

8. An integrated circuit comprising:
   an input operably powered by a first power supply; and
   a first and a second output operably powered by a second power supply, wherein the integrated circuit has an effective maximum delay of two gate delays from the input to the first and the second outputs, the first and second outputs having predetermined values during an interval when the first power supply has failed and the second power supply is active.

9. The integrated circuit, as recited in claim 8, further comprising:
   a first and a second node coupled, respectively, to the first and the second outputs; and
   a first and a second device coupled, respectively, to the first and the second nodes.

10. The integrated circuit, as recited in claim 9, wherein the first device is responsive to the first power supply and coupled to the second power supply.

11. The integrated circuit, as recited in claim 9, wherein the first device is configured as a diode.

12. The integrated circuit, as recited in claim 11, wherein the first device is a p-type transistor having a bulk coupled to the second power supply via an n-type device.

13. The integrated circuit, as recited in claim 8, wherein the first and the second power supplies are based on different power domains.

14. The integrated circuit, as recited in claim 13 wherein the first power supply is based at least in part on a core power supply.

15. The integrated circuit, as recited in claim 13, wherein the second power supply is based at least in part on an I/O power supply.

16. The integrated circuit, as recited in claim 15, wherein the second power supply is generated by voltage division of the I/O power supply.

17. The integrated circuit, as recited in claim 8, wherein the first and second outputs have complementary values based on the input during an interval when the first power supply is active and the second power supply is active.

18. The integrated circuit, as recited in claim 8, wherein the second power supply has a voltage level substantially equivalent to the voltage level of the first power supply.

19. The integrated circuit, as recited in claim 9, further comprising:
   a first inverter coupled to the first node, the first output, and the second power supply; and
   a second inverter coupled to the second node, the second output, and the second power supply.

20. The integrated circuit, as recited in claim 9, further comprising:
   a transmission gate coupled to the input, the first node, the first power supply, and a third node.

21. The integrated circuit, as recited in claim 20, further comprising:
   at least a third inverter coupled to the third node and the second power supply and responsive to the first power supply.

22. The integrated circuit, as recited in claim 8, embodied in computer readable descriptive form suitable for use in design, test, or fabrication of an integrated circuit.

23. A method comprising:
   generating, based on an input operably powered by a first power supply, complementary signals for at least a first and a second output operably powered by a second power supply in at most two gate delays during an interval where the first power supply is active;
   sensing a failure in the first power supply; and
   respectively introducing predetermined signals to the first and second outputs during an interval when the first power supply has failed and the second power supply is active.

24. The method, as recited in claim 23, further comprising:
   matching a first and second delay from the input to the first and the second outputs.

25. The method, as recited in claim 23, wherein the first and the second power supplies are based on different power domains.

26. The method, as recited in claim 23 wherein the first power supply is based at least in part on a core power supply of an integrated circuit.

27. The method, as recited in claim 23, wherein the second power supply is based at least in part on an I/O power supply.

28. The method, as recited in claim 23, further comprising:
   substantially matching the voltage level of the second power supply to the voltage level of the first power supply.

29. The method, as recited in claim 27, wherein the second power supply is generated by voltage division of the I/O power supply.

30. An apparatus comprising:
   means for generating complementary signals for at least a first and a second output from an input powered by a first power supply in at most two gate delays; and
   means for introducing predetermined signals to the first and second outputs during an interval when the first power supply fails and a second power supply is active.

31. The apparatus, as recited in claim 30, further comprising:
   means for matching a first and second delay from the input to the first and the second outputs.

32. The apparatus, as recited in claim 30, further comprising:
   means for substantially matching a voltage level of the second power supply to a voltage level of the first power supply.

* * * * *